(12) United States Patent
Kitahara et al.

(10) Patent No.: US 11,652,306 B2
(45) Date of Patent: May 16, 2023

(54) ELECTRONIC-ELEMENT MOUNTING PACKAGE AND ELECTRONIC DEVICE

(71) Applicant: KYOCERA Corporation, Kyoto (JP)

(72) Inventors: Hikaru Kitahara, Kirishima (JP); Tomoharu Onda, Kirishima (JP)

(73) Assignee: Kyocera Corporation, Kyoto (JP)

( * ) Notice: Subject to any disclaimer, the term of this patent is extended or adjusted under 35 U.S.C. 154(b) by 100 days.

(21) Appl. No.: 17/434,081

(22) PCT Filed: Feb. 27, 2020

(86) PCT No.: PCT/JP2020/008052
§ 371 (c)(1),
(2) Date: Aug. 26, 2021

(87) PCT Pub. No.: WO2020/175626
PCT Pub. Date: Sep. 3, 2020

(65) Prior Publication Data
US 2022/0140507 A1 May 5, 2022

(30) Foreign Application Priority Data

Feb. 28, 2019 (JP) .............................. JP2019-036177

(51) Int. Cl.
*H01R 12/58* (2011.01)
*H01R 12/57* (2011.01)
*H01R 13/66* (2006.01)

(52) U.S. Cl.
CPC ............. *H01R 12/58* (2013.01); *H01R 12/57* (2013.01); *H01R 13/6608* (2013.01)

(58) Field of Classification Search
CPC .... H01R 12/58; H01R 12/57; H01R 13/6608; H01L 24/48; H01L 33/483;
(Continued)

(56) References Cited

U.S. PATENT DOCUMENTS 5,557,074 A 9/1996 Miyamoto et al.
2016/0352069 A1* 12/2016 Kimura ............... H01S 5/02212
(Continued)

FOREIGN PATENT DOCUMENTS

JP 11-186425 A 7/1999
JP 2000-353846 A 12/2000
(Continued)

*Primary Examiner* — Truc T Nguyen
(74) *Attorney, Agent, or Firm* — Volpe Koenig

(57) ABSTRACT

An electronic-element mounting package includes a wiring substrate having a first surface and a wiring pattern thereon; a base having a second surface and a through hole whose opening is on the second surface; a signal line penetrating the through hole and having a first end exposed from an opening of the through hole; and an insulating member between an inner surface of the through hole and the signal line and has an end portion and a main portion. The end portion has an end surface on a side of the opening of the through hole, and the main portion is farther from the opening of the through hole than the end portion. The electronic-element mounting package also has a conductive joining material with which the wiring pattern and the first end are joined. Permittivity of the end portion is larger than permittivity of the main portion.

9 Claims, 6 Drawing Sheets

(58) Field of Classification Search
CPC ... H01L 2223/6627; H01L 2224/08225; H01L 2224/32225; H01L 33/62; H01L 23/055; H01L 23/66; H01L 2224/48227; H01L 2224/73265; H01L 2924/12041; H01L 2924/12043; H01L 2924/15192; H01L 2924/30105; H01L 2924/3011; H01L 23/49827; H01L 23/481; H01L 2223/6622; H01S 5/02345; H01S 5/02212; H01S 5/06226; H05K 1/025; H05K 3/3405; H05K 2201/049

See application file for complete search history.

(56) References Cited

U.S. PATENT DOCUMENTS

| | | | |
|---|---|---|---|
| 2022/0140507 A1* | 5/2022 | Kitahara | H01L 33/62 439/894 |
| 2023/0028370 A1* | 1/2023 | Pourghorban Saghati | H05K 1/0243 |

FOREIGN PATENT DOCUMENTS

| | | |
|---|---|---|
| JP | 2010-245507 A | 10/2010 |
| JP | 2016-225457 A | 12/2016 |

* cited by examiner

ELECTRONIC-ELEMENT MOUNTING PACKAGE AND ELECTRONIC DEVICE

CROSS REFERENCE TO RELATED APPLICATIONS

This application is the U.S. National Stage, under 35 U.S.C. § 371, of International Application No. PCT/JP2020/008052, filed Feb. 27, 2020, which claims the benefit of Japanese Patent Application No. 2019-036177, filed Feb. 28, 2019, the contents of which are hereby incorporated by reference herein.

FIELD OF INVENTION

The present disclosure relates to an electronic-element mounting package and an electronic device.

TECHINICAL BACKGROUND

Conventionally, there has been a package for mounting an electronic element that has a wiring pattern joined to the electronic element and has a signal line that is joined to the wiring pattern. Such a package has a metal base with a through hole and a signal line that penetrates an insulating member that fills the through hole to form a coaxial line structure. In such a package, a conductive joining material is used to join the signal line exposed through the opening of the through hole and the wiring pattern of a microstrip line structure (for example, see JP 2000-353846 A).

SUMMARY

An electronic-element mounting package according to an embodiment of the present disclosure includes:

a wiring substrate that has a first surface and a wiring pattern on the first surface;

a base that has a second surface and a through hole, the through hole having an opening on the second surface;

a signal line that penetrates the through hole and has a first end, the first end being exposed from an opening of the through hole;

an insulating member that occupies a space between an inner surface of the through hole and the signal line and has an end portion and a main portion, the end portion having an end surface located on a side of the opening of the through hole, and the main portion being located farther from the opening of the through hole than the end portion; and a conductive joining material with which the wiring pattern and the first end of the signal line are joined, wherein permittivity of the end portion of the insulating member is larger than permittivity of the main portion of the insulating member.

An electronic device according to another embodiment of the present disclosure includes:

the above electronic-element mounting package; and an electronic element that is joined to the wiring pattern.

DETAILED DESCRIPTION

Hereinafter, embodiments will be explained with reference to the drawings.

(Configuration of Electronic Device and Electronic-Element Mounting Package)

First, a configuration of an electronic device 1 and an electronic-element mounting package 100 according to an embodiment will be explained with reference to FIG. 1 to FIG. 3.

Figure 1:
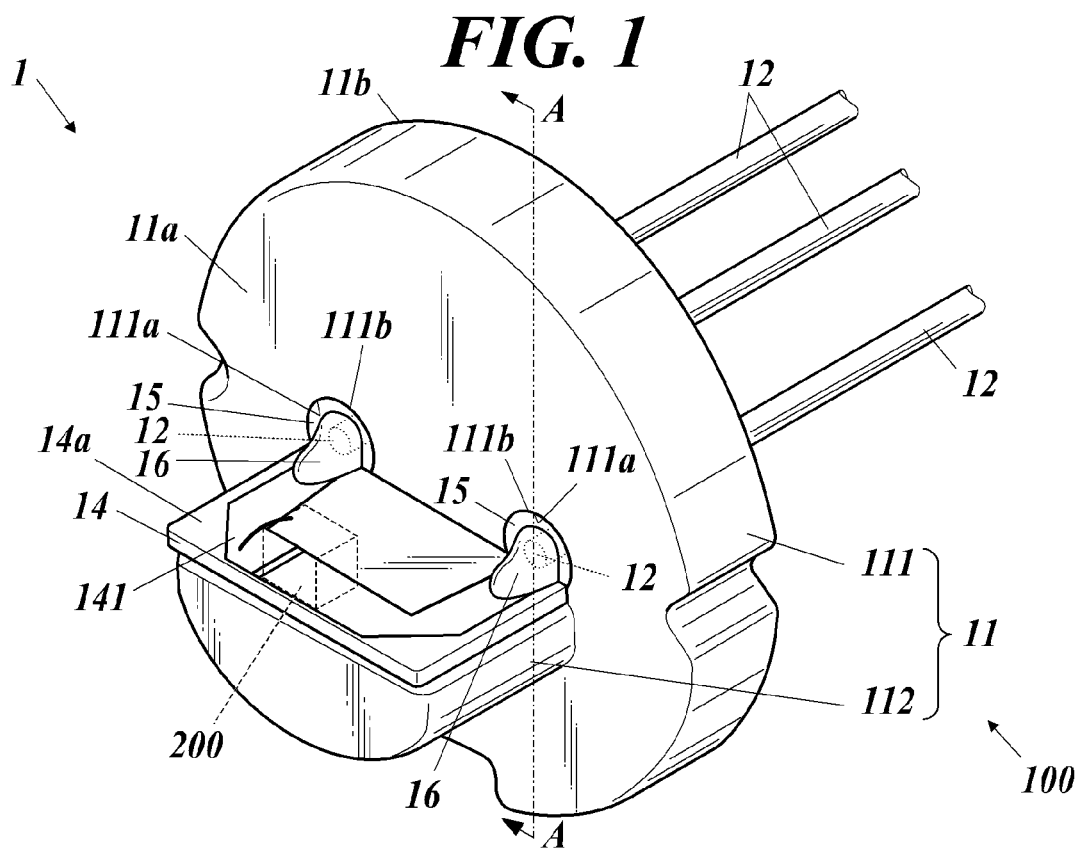
FIG. 1 is an overall perspective view of an electronic device of an embodiment.

FIG. 1 is an overall perspective view of the electronic device 1 of this embodiment.

Figure 2:
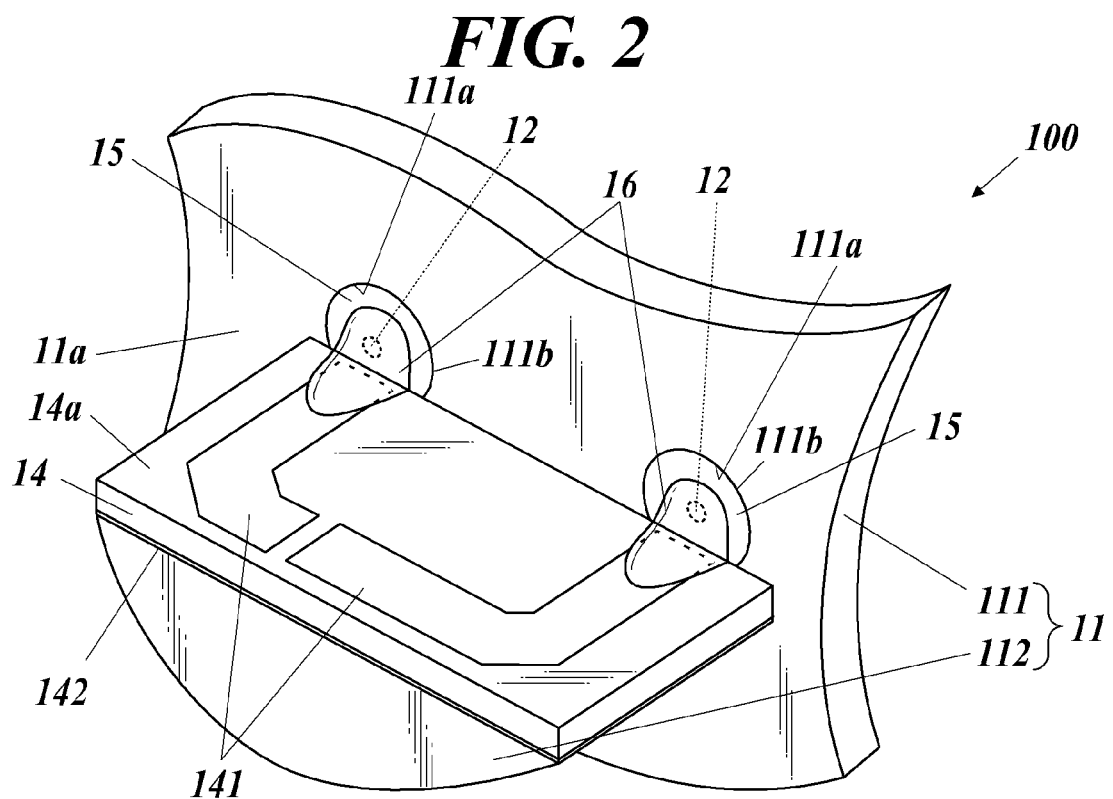
FIG. 2 is a diagram showing an enlarged view around a joining position with a conductive joining material in FIG. 1.

FIG. 2 is a diagram showing an enlarged view of the electronic-element mounting package 100 included in the electronic device 1, showing a portion around a joining position with the conductive joining material 16.

Figure 3:
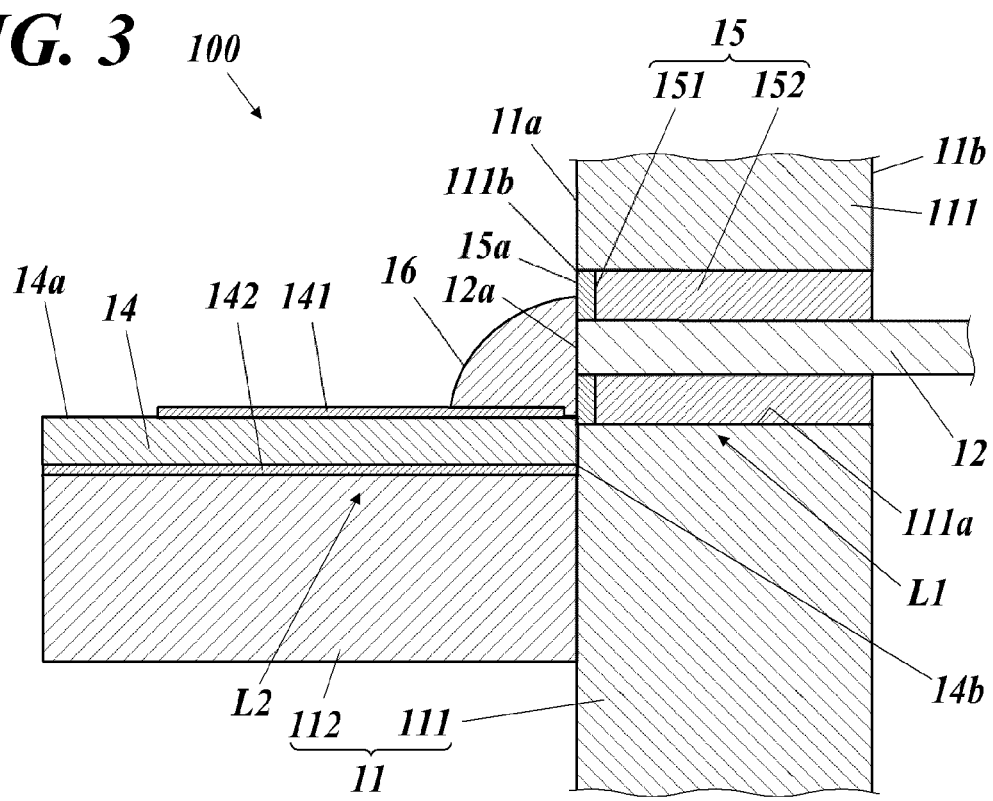
FIG. 3 is a diagram showing a cross-section of an electronic-element mounting package at a position (A-A) that passes a signal line in FIG. 1.

FIG. 3 is a diagram showing a cross-section of the electronic-element mounting package 100 at the position (A-A) through a signal line 12.

The electronic device 1 includes the electronic-element mounting package 100 and an electronic element 200.

The electronic-element mounting package includes a base 11, a signal line(s) 12, a wiring substrate 14, an insulating member 15, a conductive joining material 16, and the like.

The base 11 is a conductive metal and functions as a ground surface. In addition to this, the base 11 may be a highly thermally conductive (heat dissipating) material. The base 11 has a base portion 111 and a projection portion 112. The base 11 has a disc shape with a diameter of 3 to 10 mm and a thickness of 0.5 to 2 mm, for example, but not limited thereto. The base portion 111 has a through hole 111a. The through hole 111a is filled with the insulating member 15. The material of the insulating member and the size of the through hole 111a may be determined depending on a desired characteristic impedance. The base portion 111 and the projection portion 112 may be integrally formed.

In this embodiment, the through hole 111a has a cylindrical shape having an axis extending in a direction perpendicular to a second surface 11a. That is, an opening 111b of the through hole 111a in the second surface 11a has a circular shape.

The projection portion 112 has a flat surface on one side, and the wiring substrate 14 is located on the one side. The wiring substrate 14 has a first surface 14a. This first surface 14a is a surface opposite to a connection surface with the projection portion 112. The wiring substrate 14 has a wiring pattern 141 on the first surface 14a and a ground layer 142 on a surface opposite to the first surface 14a (on a surface on the projection portion 112 side). Here, the wiring substrate 14 is used, for example, as a high-frequency line substrate. The wiring substrate 14 is an insulating substrate and is, for example, made of resin. The thickness and material properties (relative permittivity) of the wiring substrate 14 may be determined as appropriate depending on the desired characteristic impedance. In this embodiment, one surface among the lateral surfaces of the wiring substrate 14 is joined to the second surface 11a of the base portion 111. This one surface is in contact with the first surface 14a, and as shown in FIG. 3, will be referred to as the joining surface 14b in the followings. The wiring substrate 14 may be separated from the base portion 111 as long as the connection is not prevented between the wiring pattern 141 and the signal line 12 described later.

The signal line 12 is a rod-shaped conductive material. The signal line 12 penetrates the insulating member 15 in the through hole 111a of the base portion 111 and is exposed from the opening 111b of the through hole 111a in the second surface 11a. In other words, as shown in FIG. 3, the signal line 12 is exposed from the end surface 15a of the insulating member 15 at the opening 111b. That is, the signal line 12 penetrates the through hole 111a and the insulating member 15 fills the space between the inner surface of the through hole 111a and the signal line 12. The diameter of the signal line 12 is, for example, about 0.1 to 1.0 mm. At least one signal line 12 is a ground terminal of the base 11 and is directly joined to the base portion 111. Other signal line(s) 12 protrudes on a side of a surface 11b opposite to the second surface 11a of the base portion 111, and is electrically connected to external wiring and the like, and is used as a lead electrode(s). FIG. 1 and FIG. 2 show two signal lines 12 joined to the wiring pattern 141 with the conductive joining material 16 on the side of the second surface 11a.

A tip (first end 12a) of the signal line 12 is exposed from the end surface 15a of the insulating member 15 at the second surface 11a of the base portion 111, at approximately the center in the circular opening 111b of the through hole 111a. Also, as shown in FIG. 3, the tip (first end 12a) of the signal line 12 is exposed without protruding from the end surface 15a of the insulating member 15. In other words, the tip (first end 12a) of the signal line 12 is on the same plane as the end surface 15a of the insulating member 15. The insulating member 15 separates the signal line 12 inside the insulating member 15 from the base portion 111 that is on the outside. A coaxial line L1 is formed by the base portion 111 (through hole 111a), the insulating member 15, and the signal line 12 with such a configuration. Signals are transmitted in the base portion 111 via this coaxial line L1.

In this embodiment, glass having a predetermined permittivity is used as the insulating member 15. In more detail, the permittivity of the insulating member 15 is larger at the end portion 151 on the opening 111b side (see FIG. 3) than at the main portion 152, which is the part other than the end portion 151. In other words, in the insulating member 15, the end portion 151 is glass having a first permittivity, and the main portion 152 adjacent to the end portion 151 is glass having a second permittivity, and the first permittivity is larger than the second permittivity. Therefore, in the insulating member 15, the relative permittivity of the end portion 151 is larger than the relative permittivity of the main portion 152.

The length of the end portion 151 in a direction along the signal line 12 may be smaller than a quarter of a wavelength of the signals transmitted by the signal line 12. Signals having a frequency of about 60 GHz can be transmitted by the signal line 12 of this embodiment. Therefore, when, for example, glass having a relative permeability of 6.8 is used as the insulating member 15 of the coaxial line L1, the wavelength of the signal to be transmitted will be about 1.9 mm, and the length of the end portion 151 may be 0.48 mm or less.

The wiring pattern 141 formed on the wiring substrate is electrically connected to the electronic element 200 to supply power and signal(s) to the electronic element 200. The end portions (two end portions in this case) of the wiring pattern 141 are joined to the signal line 12 with the conductive joining material 16. The shape, length, and position of the wiring pattern 141 are determined depending on the size and terminal position of the electronic element 200 to be connected. The ground layer 142 may be formed on the entire surface of a side of the projection portion 112 of the wiring substrate 14, and is joined to the projection portion 112 to provide a ground potential. The wiring pattern 141 and the ground layer 142 may be a conductive metal film having low resistance, in this case, a gold (Au) thin film.

As shown in FIG. 2, in the wiring pattern 141, the wiring portion that is connected to the signal line 12 extends on the wiring substrate 14 almost perpendicular to the second surface 11a to the immediate vicinity of the end surface 15a of the insulating member 15. The wiring pattern 141 is separated from the ground layer 142 by the wiring substrate 14. The wiring pattern 141 and the ground layer 142 form a microstrip line L2 on the wiring substrate 14 and the microstrip line L2 transmits signals.

The conductive joining material 16 is placed between the signal line 12 and the second surface 11a, and the wiring pattern 141 and the first surface 14a. As a result, the signal line 12 exposed on the second surface 11a and the wiring pattern 141 on the first surface 14a are electrically joined with the conductive joining material 16. The conductive joining material 16 can be silver sintering paste or copper sintering paste. The sintering paste contains a mixture of a conductive metal such as silver or copper and a protective molecule such as resin, and adheres when heated due to the reaction of the resin to bond the contained conductive metals. At this time, the resin component also bonds with an insulating surface. Therefore, not only the signal line 12 and the wiring pattern 141, but also the insulating member 15 and an insulating surface of the wiring substrate 14 are joined with the conductive joining material 16.

The electronic element 200 shown by dashed lines in FIG. 1 is located on the first surface 14a and is electrically connected (joined) to the wiring pattern 141 directly and/or by wire bonding or the like. The electronic element 200 may be a semiconductor element. For example, the electronic element 200 is a laser diode. Alternatively, the electronic element 200 may be a photodiode, LED (Light Emitting Diode), Peltier element, various sensor elements, or other various types of elements. The heat generated due to the operation of the electronic element 200 is discharged via the base 11.

The projection portion 112, the wiring substrate 14 (wiring pattern 141, ground layer 142), and the electronic element 200 may be covered with a cover member (lid) not shown in the figure to be isolated from the outside. When the electronic element 200 emits light to the outside, the cover member may have a window made of a material that transmits light of the wavelength of the emitted light.

(Characteristic Impedance Matching between Coaxial Line L1 and Microstrip Line L2)

Next, effects according to the configuration of this embodiment on the characteristic impedance matching between the coaxial line L1 and the microstrip line L2 will be explained in comparison with the comparative example.

Figure 4:
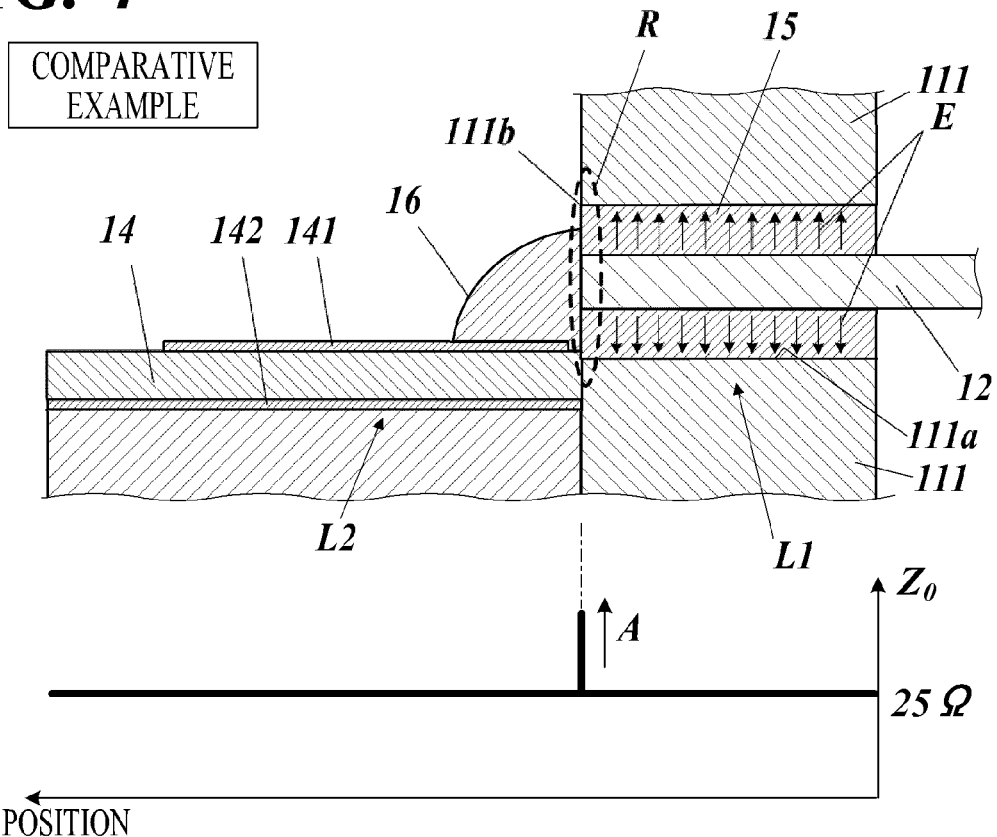
FIG. 4 is a diagram to explain a problem related to characteristic impedance mismatch in a comparative example.

First, with reference to FIG. 4, the problem related to characteristic impedance mismatch in the comparative example will be explained. The configuration of the comparative example in FIG. 4 differs from that of the present embodiment shown in FIG. 3 in that the entire insulating member 15 has uniform permittivity. The graph at the bottom of FIG. 4 shows the characteristic impedance at each position of the coaxial line L1 and microstrip line L2.

The characteristic impedance of the coaxial line L1 and the microstrip line L2 is matched so that the characteristic impedance becomes a predetermined reference value (in this case, 25Ω). However, the impedance tends to change (especially increase) locally in the vicinity of the border between the coaxial line L1 and the microstrip line L2. One of the reasons for this is that the electric field E between the signal line 12 and the base portion 111 becomes weaker in the vicinity region of the border between the coaxial line L1 and the microstrip line L2 (the region schematically shown by a dashed ellipse in FIG. 4 and hereinafter referred to as a "boundary region R"). In other words, as the electric field E in the boundary region R becomes weaker, the capacitance C in the boundary region R decreases, which leads to an increase in the characteristic impedance.

In more detail, the capacitance C per unit length of the coaxial line L1 is expressed by an equation (1), where the relative permittivity of the insulating member in the coaxial line L1 is ε, an area of an electrode is S, and the potential difference between electrodes is V.

$$C = \varepsilon SE/V \quad (1)$$

In the boundary region R with the microstrip line L2, the electric field E in equation (1) becomes smaller, thereby the capacitance C becomes smaller.

On the other hand, the characteristic impedance $Z_0$ of the coaxial line L1 is expressed by an equation (2), where the inductance per unit length is L.

$$Z_0 = (L/C)^{1/2} \quad (2)$$

At the boundary region R with the microstrip line L2, the capacitance C in the equation (1) is reduced as described above, and the characteristic impedance $Z_0$ in the equation (2) is increased. As a result, as indicated by an arrow A in the graph at the bottom of FIG. 4, the characteristic impedance locally increases locally with respect to the reference value in the vicinity of the border between the coaxial line L1 and the microstrip line L2. This causes a characteristic impedance mismatch between the coaxial line L1 and the microstrip line L2.

Figure 5:
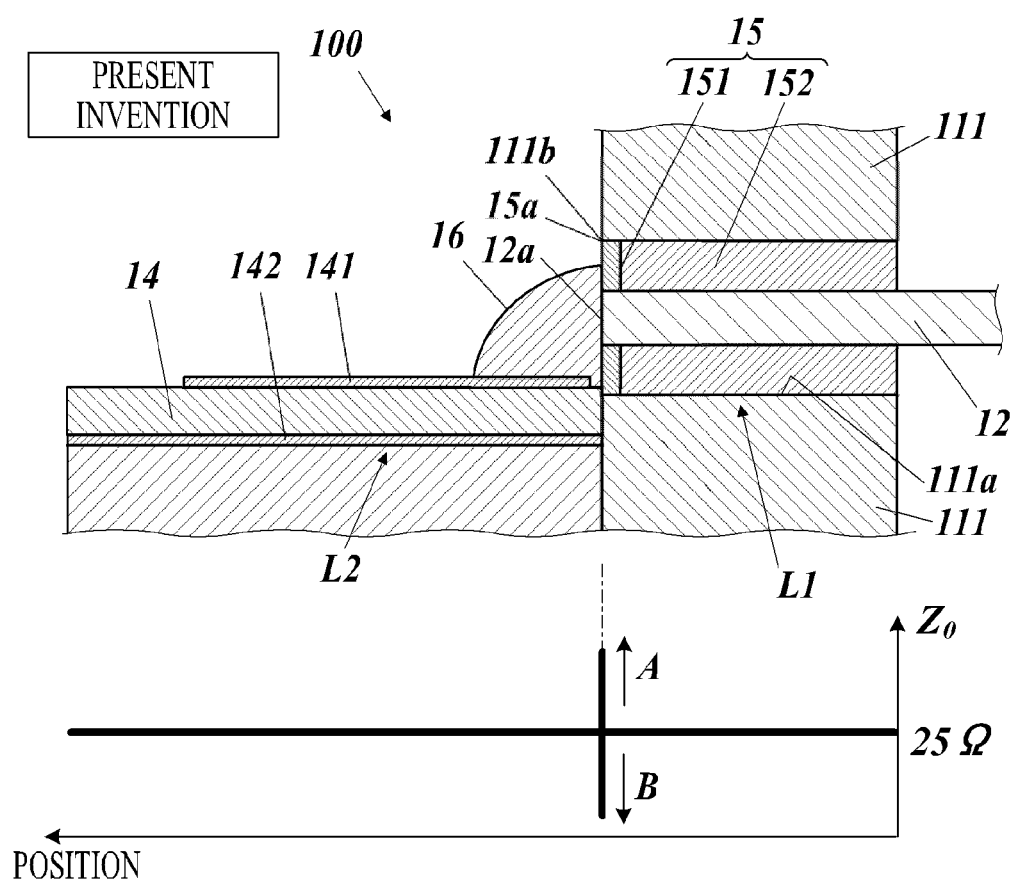
FIG. 5 is a diagram to explain a problem related to characteristic impedance matching in an example of the embodiment.

In contrast, in the configuration of this embodiment shown in the example of FIG. 5, the permittivity of the end portion 151 of the insulating member 15, which is near the border with the microstrip line L2, is larger than the permittivity of the main portion 152, which is the insulating member 15 other than the end portion 151. Therefore, the characteristic impedance mismatch in the above comparative example is reduced. This effect will now be explained with reference to FIG. 5.

In the region where the end portion 151 of the insulating member 15 is formed in the coaxial line L1, the relative permittivity ε in the equation (1) becomes larger than in the region where the main portion 152 is formed, and the capacitance C increases. Therefore, as a result of increase in the capacitance C in the equation (2), the characteristic impedance Z0 becomes smaller in the region where the end portion 151 is formed. Therefore, as shown in the graph at the bottom of FIG. 5, the increase in characteristic impedance due to the decreased electric field E (arrow A) and the decrease in characteristic impedance due to the increased the permittivity of the end portion 151 of the insulating member 15 (arrow B) cancel each other out, and as a result, the change in characteristic impedance is small in the vicinity of the border between the coaxial line L1 and the microstrip line L2. As a result, the characteristic impedance mismatch between the coaxial line L1 and the microstrip line L2 is reduced. This effectively reduces power losses, especially for high-frequency signals, and allows good transmission characteristics to be obtained.

Also, as described above, the length of the end portion 151 in the direction along the signal line 12 is smaller than a quarter of the wavelength of the signal transmitted by the signal line 12. Therefore, the characteristic impedance can be lowered by increasing the permittivity of the end portion 151 within a sufficiently small range relative to the wavelength of the transmitted signal from the border position of the coaxial line L1 and the microstrip line L2. As a result, the characteristic impedance can be matched more effectively.

Figure 6A:
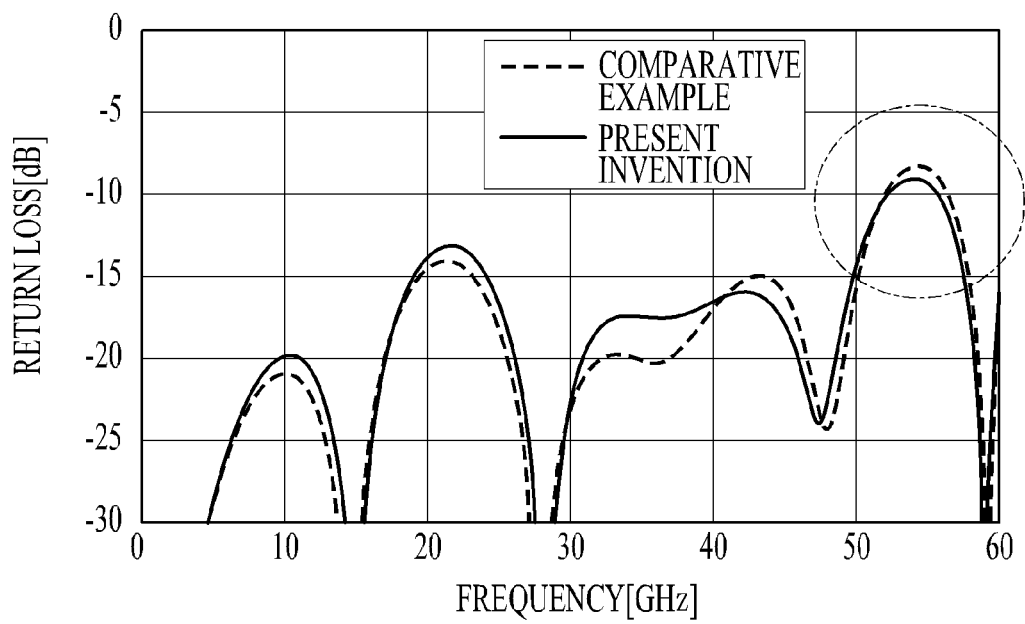
FIG. 6A is a diagram showing simulation results of return losses in the electronic-element mounting packages calculated against frequency of a signal.
Figure 6B:
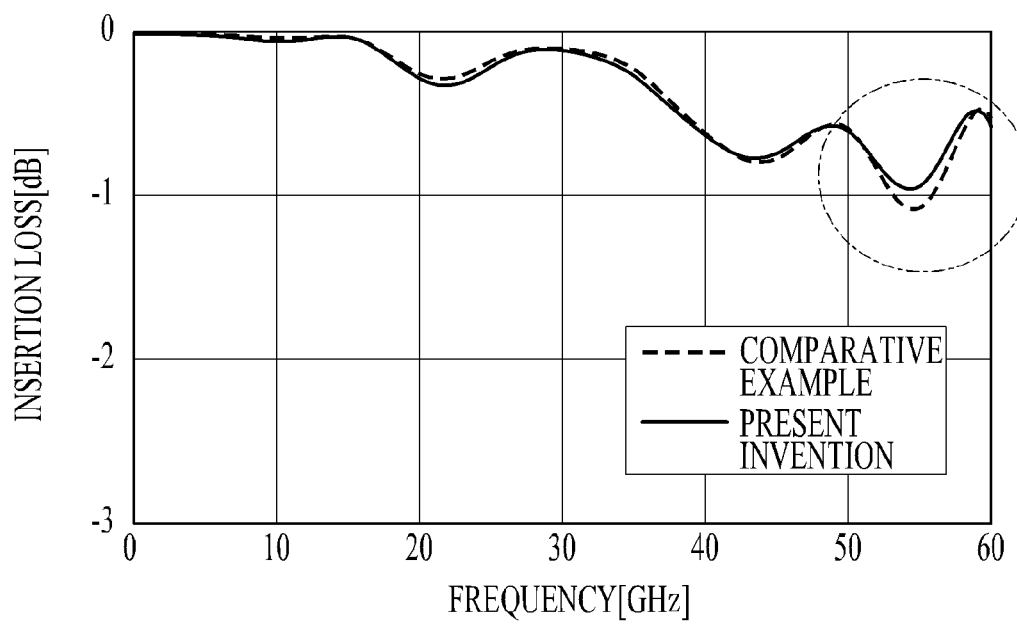
FIG. 6B is a diagram showing simulation results of insertion losses in the electronic-element mounting packages calculated against frequency of a signal.

FIG. 6A and FIG. 6B show simulation results of losses in the electronic-element mounting package 100 of the example of the present invention in FIG. 5, and in an electronic-element mounting package of the comparative example in FIG. 4, calculated against the frequency of the signal. In FIG. 6A and FIG. 6B, the simulation results of the example of the present invention are shown by solid lines, and the simulation results of the comparative example are shown by dashed lines.

As shown in FIG. 6A, the return loss of the example of the present invention is lower than the return loss of the comparative example in the high frequency band above 50 GHz indicated by the ellipse in the chain. (The closer the return loss is to zero, the greater the reflection to the incident.) Also, as shown in FIG. 6B, the insertion loss of the example of the present invention was lower than the insertion loss of the comparative example in the high frequency band. (The larger the absolute value, the larger the loss.)

(Manufacturing Method of Electronic-Element Mounting Package 100)

FIG. 7A to FIG. 7D are diagrams to explain a manufacturing method of the electronic-element mounting package 100 in which the permittivity of the end portion 151 is larger than the permittivity of the main portion 152.

Figure 7A:
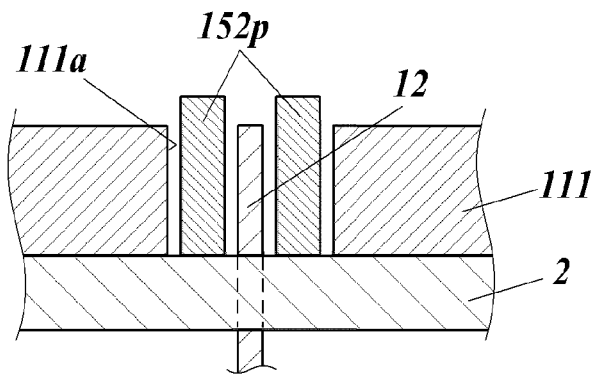
FIG. 7A is a diagram to explain a manufacturing method of the electronic-element mounting package according to the embodiment.

In the manufacturing method of the electronic-element mounting package 100, first, the base portion 111 having a through hole 111a is placed in a jig 2, and the signal line 12 is arranged through the hole in the jig 2 into the through hole 111a. In this state, as shown in FIG. 7A, a preform glass 152p formed into a cylindrical shape is placed between the base portion 111 and the signal line 12. Here, the preform glass 152p has a volume less than the volume of the space between the base portion 111 and the signal line 12.

Figure 7B:
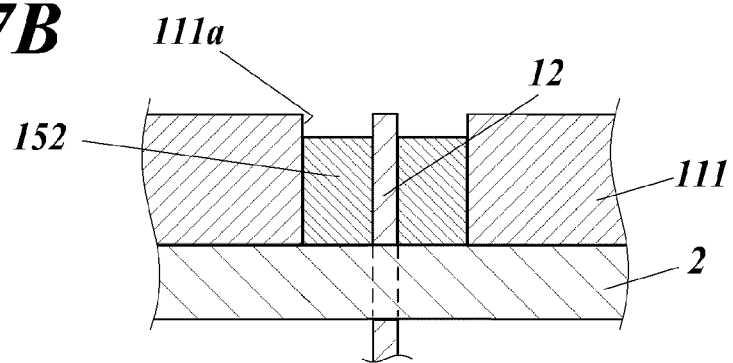
FIG. 7B is a diagram to explain a manufacturing method of the electronic-element mounting package according to the embodiment.

Next, as shown in FIG. 7B, each component placed on the jig 2 is heated to a temperature higher than the melting temperature T152p of the preform glass 152p, and the preform glass 152p is melted. Thereafter, the melted preform glass 152p is cooled to a temperature below the melting temperature T152p, such that the main portion 152 of the insulating member 15 is formed in the inside of the through hole 111a, except for a part in the vicinity of the upper end.

Figure 7C:
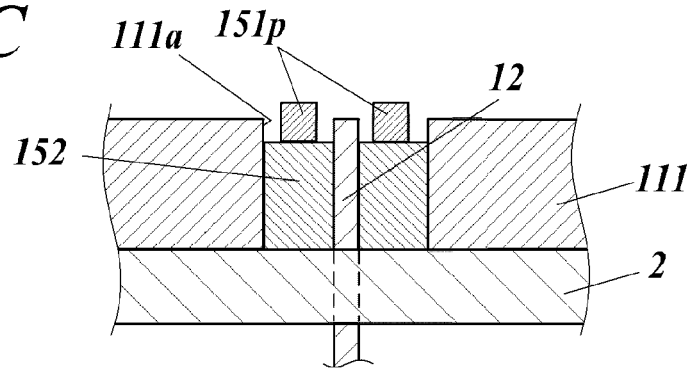
FIG. 7C is a diagram to explain a manufacturing method of the electronic-element mounting package according to the embodiment.

Next, as shown in FIG. 7C, a preform glass 151p formed in a cylindrical shape is placed between the base portion 111 and the signal line 12, superimposed on the main portion 152. The preform glass 151p has a lower melting temperature and a higher permittivity than the preform glass 152p. In other words, the melting temperature T151p of the preform glass 151p is lower than the melting temperature T152p of the preform glass 152p. In addition, the preform glass 151p to be used has the same volume as the volume of a cylindrical space enclosed by the base portion 111, the signal line 12 and the main portion 152.

Figure 7D:
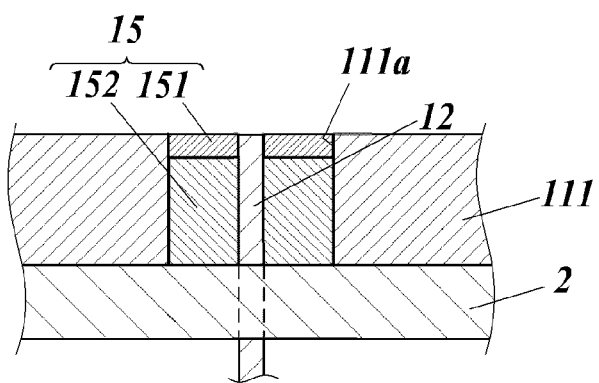
FIG. 7D is a diagram to explain a manufacturing method of the electronic-element mounting package according to the embodiment.

Next, as shown in FIG. 7D, each member placed on the jig 2 is heated to a temperature above the melting temperature T151p of the preform glass 151p and below the melting temperature T152p of the preform glass 152p so that the preform glass 151p is melted. After that, the melted preform glass 151p is cooled to a temperature below the melting temperature T151p, so that the end portion 151 of the insulating member 15 is formed in the vicinity of the upper end inside the through hole 111a. After that, the base portion 111 is separated from the jig 2 and the other components shown in FIG. 1 are attached, thereby the electronic element mounting package 100 is completed.

Contrary to the order shown in FIG. 7A to FIG. 7D, the preform glass 151p may be melted first to form the end portion 151, and then the preform glass 152p may be melted to form the main portion 152. In this case, the preform glass 151p with a higher melting temperature than the preform glass 152p can be used. In this case, by forming the end portion 151 on the surface of the jig 2 with the signal line 12 abutting against the surface of the jig 2, the position of the tip of the signal line 12 can be easily aligned with the position of the end surface 15a of the end portion 151.

MODIFIED EXAMPLE 1

Figure 8:
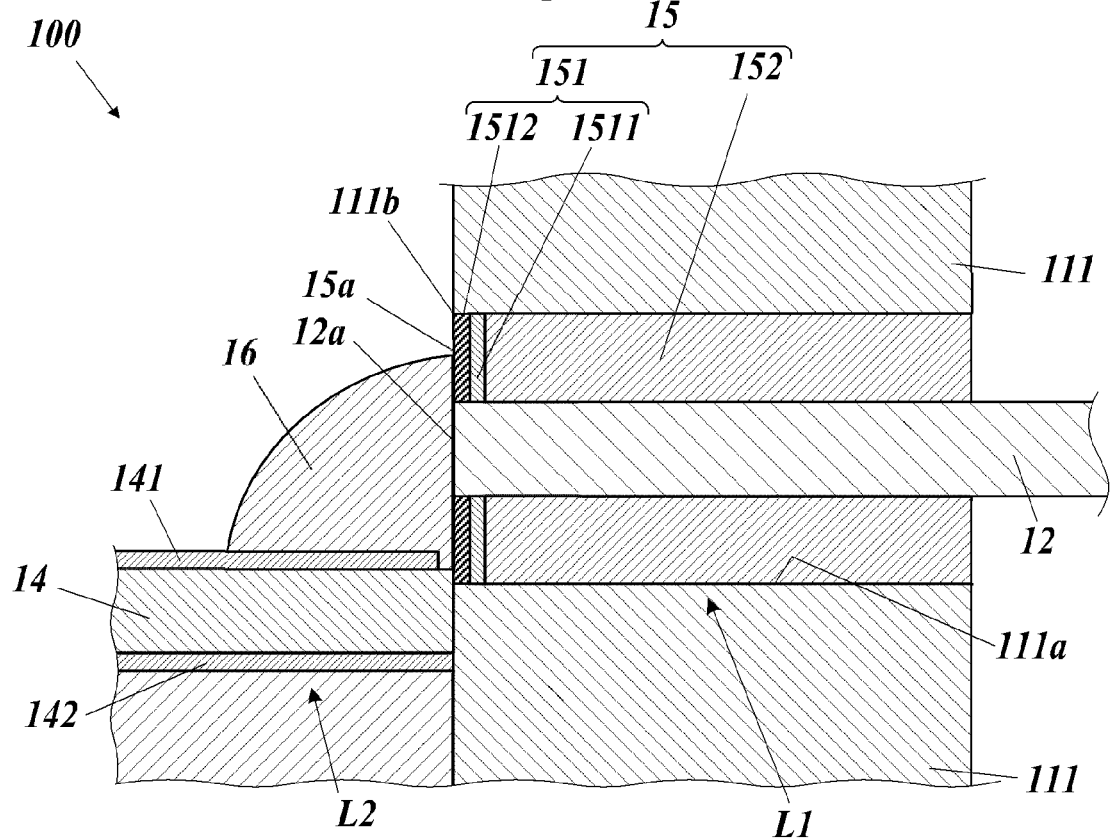
FIG. 8 is a cross-sectional view showing a modified example 1 of the electronic-element mounting package of the embodiment.

FIG. 8 is a cross-sectional view showing a modified example 1 of the electronic-element mounting package 100 of the above embodiment. In the electronic-element mounting package 100 of the modified example 1, the end portion 151 of the insulating member 15 has a larger permittivity at a portion of the end portion 151 closer to the end surface 15a on the aperture 111b side. That is, the end portion 151 includes a first portion 1511 adjacent to the main portion 152 and a second portion 1512 adjacent to the aperture 111b side of the first portion 1511. The permittivity of the first portion 1511 is larger than the permittivity of the main portion 152, and the permittivity of the second portion 1512 is larger than the permittivity of the first portion 1511.

In general, in the vicinity of the border between the coaxial line L1 and the microstrip line L2, the closer to the border, the steeper the decrease in the electric field becomes, and the more rapidly the characteristic impedance increases. According to the configuration of this modified example 1, the permittivity can be increased step by step in accordance with this rapid increase in the characteristic impedance. Therefore, it is possible to more appropriately offset the increase in the characteristic impedance due to the decrease in the electric field and the decrease in the characteristic impedance due to the increase in the permittivity of the end portion 151 of the insulating member 15. As a result, the characteristic impedance can be matched appropriately.

The permittivity in the end portion 151 may be configured to change in three or more steps. Alternatively, the permittivity may not change in steps, but may increase smoothly and gradually within the end portion 151 toward the opening 111b. When the permittivity of the first part 1511 and the permittivity of the second part 1512 both gradually increase, the increasing rate of the permittivity of the first part 1511 and the increasing rate of the permittivity of the second part 1512 may be the same or may be different. When the increasing rate of the permittivity of the second portion 1512 is larger than the increasing rate of the permittivity of the first portion 1511, the effect of reducing the characteristic impedance mismatch is enhanced in accordance with the rapid increase in the characteristic impedance in the vicinity of the border.

MODIFIED EXAMPLE 2

Figure 9:
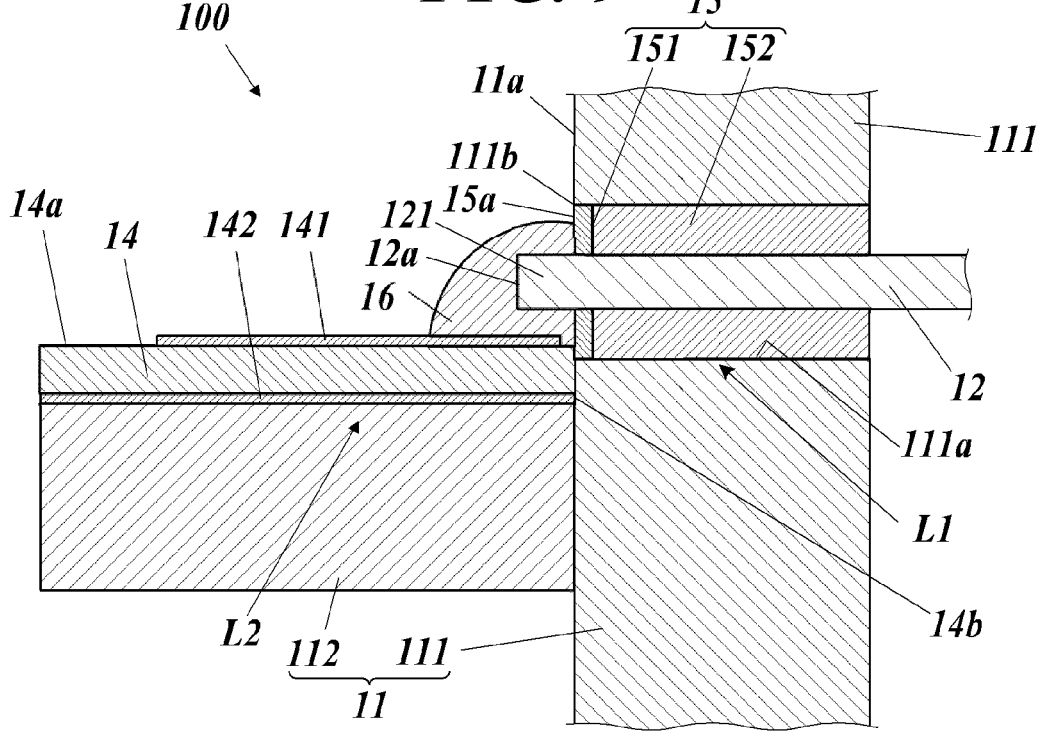
FIG. 9 is a cross-sectional view showing a modified example 2 of the electronic-element mounting package of the embodiment.

FIG. 9 is a cross-sectional view showing a modified example 2 of the electronic-element mounting package 100 of the above embodiment. The electronic-element mounting package 100 of the modified example 2 is different from the above embodiment in that the tip (first end 12a) of the signal line 12 protrudes from the end surface 15a of the insulating member 15 towards the side of the microstrip line L2. The protruding portion 121 of the signal line 12 that protrudes from the end surface 15a to the outside of the insulating member 15 is covered by the conductive joining material 16. This enables the space between the protruding portion 121 of the signal line 12 and the wiring pattern 141, that is, the space where the capacitance C can be formed by the protruding portion 121 of the signal line 12 and the wiring pattern 141, to be maintained at the same potential as the signal line 12 and the wiring pattern 141. Therefore, the capacitance C between the protruding portion 121 of the signal line 12 and the wiring pattern 141 can be made extremely small, and the change in the characteristic impedance caused by the capacitance C can be made practically negligible. Therefore, impedance matching can be performed in the same way as in the above embodiment even in the configuration with the signal line 12 protruding as in the modified example 2.

The simulation results of losses in the electronic-element mounting package 100 of the modified example 2 calculated against the frequency of the signal are the same as the results of the present invention shown by solid lines in FIG. 6A and FIG. 6B.

MODIFIED EXAMPLE 3

In the above embodiment, both the end portion 151 and the main portion 152 of the insulating member 15 are made of glass, but not limited to this configuration. Any insulating member other than glass may be used as the insulating member 15. However, by using a material (typically, glass) that can be melted and then solidified in the through hole 111a to shape the main portion 152, it is possible to ensure airtightness between the signal line 12 and the base portion 111 in the coaxial line L1. The end portion 151 does not necessarily have to be made of a material that can ensure airtightness, since it is a member that is arranged in a limited range on the side of the opening 111b. Therefore, the end portion 151 may be made of insulating resin or ceramic material, for example.

As described above, the electronic-element mounting package 100 of this embodiment includes the wiring substrate 14 having the first surface 14a and the wiring pattern 141 on the first surface 14a, and the base 11 having the second surface 11a and the through hole 111a opening at the second surface 11a. The electronic-element mounting package 100 also includes a signal line 12 that penetrates the through hole 111a and has the first end 12a exposed from the opening 111b of the through hole 111a, and the insulating member 15 that fills the space between the inner surface of the through hole 111a and the signal line 12 and having the end portion 151 with the end surface 15a located on the side of the opening 111b of the through hole 111a, and the main portion 152 located farther from the opening 111b of the through hole 111a than the end portion 151. The electronic-element mounting package 100 also includes the conductive joining material 16 with which the wiring pattern 141 and the first end 12a of the signal line 12 are joined. The permittivity of the end portion 151 of the insulating member 15 is larger than the permittivity of the main portion 152 of the insulating member 15.

In this way, the permittivity is increased at the end portion 151 of the insulating member 15 of the coaxial line L1, in the vicinity of the border with the microstrip line L2 having the wiring pattern 141. This increases the capacitance in the vicinity of the border and reduces the characteristic impedance. Therefore, in the vicinity of the aforementioned border, it is possible to offset the increase in the characteristic impedance due to the decrease in the electric field and the decrease in the characteristic impedance due to the increase in the permittivity of the end portion 151 of the insulating member 15, thereby reducing the change in the characteristic impedance. As a result, the mismatch of the characteristic impedance between the coaxial line L1 and the microstrip line L2 is reduced. This effectively reduces the power loss of signals especially at high frequencies, and good signal transmission characteristics can be obtained.

The end portion 151 of the insulating member 15 in the above modified example 1 may have the first portion 1511 adjacent to the main portion 152 and the second portion 1512 adjacent to the first portion 1511 and including the end surface 15a, and the permittivity of the second portion 1512 may be larger than the permittivity of the first portion 1511. Also, the permittivity of the end portion 151 of the insulating member 15 in the above modified example 1 may be larger as it is closer to the end surface 15a. As a result, the permittivity can be increased step by step in accordance with the rapid increase in the characteristic impedance in the vicinity of the border between the coaxial line L1 and the microstrip line L2. Therefore, it is possible to more suitably offset the increase in the characteristic impedance due to the decrease in the electric field and the decrease in the characteristic impedance due to the increase in the permittivity of the end portion 151 of the insulating member 15.

The tip (first end 12a) of the signal line 12 does not have to protrude from the end surface 15a of the insulating member 15. This reduces noise and other problems caused by the signal line 12 protruding from the coaxial line L1 and located in parallel with the wiring pattern 141. Also, it is possible to reduce the mismatch of characteristic impedance due to the capacitance between the protruding signal line 12 and the wiring pattern 141, which increases the characteristic impedance.

Also, in the above modified example 2, the signal line 12 has the protruding portion 121 having the first end 12a and protruding from the end surface 15a of the insulating member 15. The protruding portion 121 may be covered with the conductive joining material 16. According to this, the space between the protruding portion 121 of the signal line 12 and the wiring pattern 141 can be kept at the same potential as the signal line 12 and the wiring pattern 141. Therefore, the capacitance between the protruding portion 121 of the signal line 12 and the wiring pattern 141 can be made extremely small, and the change in the characteristic impedance caused by the capacitance can be reduced to a substantially negligible level.

The insulating member 15 may be glass. Such glass is formed by melting and then solidifying it in the space between the signal line 12 and the base portion 111 in the coaxial line L1, so that the airtightness of the space can be secured by the glass. Therefore, it is possible to reduce the deterioration of signal transmission characteristics caused by air entering the above space and causing the permittivity to deviate from a desired value.

Also, as shown in the above modified example 3, the end portion 151 of the insulating member 15 may be made of resin and the main portion 152 may be made of glass. Even with this configuration, the glass of the main portion 152 can sufficiently ensure the airtightness of the space in the coaxial line L1 between the signal line 12 and the base portion 111. In addition, it is possible to increase the permittivity of the end portion 151 so as to reduce mismatch in the characteristic impedance.

The length of the end portion 151 of the insulating member 15 in the direction along the signal line 12 may be shorter than a quarter of the wavelength of the signal transmitted by the signal line 12. This can more effectively reduce the mismatch in the characteristic impedance.

The electronic device 1 of the present embodiment also includes the above-mentioned electronic-element mounting package 100 and the electronic element 200 that is joined to the wiring pattern 141. In such an electronic device 1, power loss of signals can be reduced by appropriate characteristic impedance matching, and the electronic element 200 can be operated effectively without wasting power consumption.

The above embodiment is an example, and various changes can be made.

For example, the first surface 14a and the second surface 11a do not have to be orthogonally aligned, and the shapes of the respective surfaces, and the like, may be set as appropriate depending on the electronic element 200, and the like. Also, the wiring portion of the wiring pattern 141 that is joined to the signal line 12 may not extend in a direction orthogonal to the second surface 11a.

When the microstrip line L2 can be configured by the wiring pattern 141 on the first surface 14a of the wiring substrate 14 and the metal projection portion 112, the ground layer 142 may be omitted.

In the above embodiment, silver sintering paste or copper sintering paste is used as the conductive joining material 16, but the conductive joining material 16 can be any other material as long as it is a conductive joining material that is joined to the wiring substrate 14.

In the FIG. 3 of the above embodiment, an example of the tip (first end 12a) of the signal line 12 being in the same plane as the end surface 15a of the insulating member 15 has been described, but this does not limit the embodiment. The tip (first end 12a) of the signal line 12 can be inside the end surface 15a of the insulating member 15 (to the right of the end surface 15a in FIG. 3). In other words, the tip (first end 12a) of the signal line 12 may be at a position recessed from the end surface 15a of the insulating member 15. In this case as well, the tip (first end 12a) of the signal line 12 can be contacted with the conductive joining material 16 to connect the signal line 12 to the wiring pattern 141.

Specific details such as the configuration, structure, position relationship, and shape shown in the above embodiments can be changed as necessary without departing from the scope of the present disclosure.

INDUSTRIAL APPLICABILITY

The present invention can be used for electronic-element mounting packages and electronic devices.

REFERENCE SIGNS LIST

1 Electronic Device
2 Jig
11 Base
11a Second Surface
111 Base Portion
111a through hole
111b Opening
112 Projection Portion
12 Signal Line
12a Tip (First End)
121 Protruding Portion
14 Wiring Substrate
14a First Surface
14b Joining Surface
141 Wiring Pattern
142 Ground Layer
15 Insulating member
15a End Surface
151 End portion
1511 First Portion
1512 Second Portion
152 Main portion
16 Conductive Joining Material
100 Electronic-Element Mounting Package
200 Electronic Element
L1 Coaxial Line
L2 Microstrip Line

The invention claimed is:

1. An electronic-element mounting package comprising:
a wiring substrate that has a first surface and a wiring pattern on the first surface;
a base that has a second surface and a through hole, the through hole having an opening on the second surface;
a signal line that penetrates the through hole and has a first end, the first end being exposed from the opening of the through hole;
an insulating member that occupies a space between an inner surface of the through hole and the signal line and has an end portion and a main portion, the end portion having an end surface located on a side of the opening of the through hole, and the main portion being located farther from the opening of the through hole than the end portion; and
a conductive joining material with which the wiring pattern and the first end of the signal line are joined,
wherein permittivity of the end portion of the insulating member is larger than permittivity of the main portion of the insulating member.

2. The electronic-element mounting package according to claim 1, wherein
the end portion of the insulating member has a first portion adjacent to the main portion and a second portion adjacent to the first portion and including the end surface, and
permittivity of the second portion is larger than permittivity of the first portion.

3. The electronic-element mounting package according to claim 2, wherein
permittivity of the end portion of the insulating member is larger as being closer to the end surface.

4. The electronic-element mounting package according to claim 1, wherein
the first end of the signal line does not protrude from the end surface of the insulating member.

5. The electronic-element mounting package according to claim 1, wherein
the signal line has a protruding portion that includes the first end and protrudes from the end surface of the insulating member, and
the protruding portion is covered with the conductive joining material.

6. The electronic-element mounting package according to claim 1, wherein
the insulating member is glass.

7. The electronic-element mounting package according to claim 1, wherein
the end portion of the insulating member is resin, and
the main portion of the insulating member is glass.

8. The electronic-element mounting package according to claim 1, wherein
a length of the end portion of the insulating member in a direction along the signal line is smaller than a quarter of a wavelength of a signal transmitted by the signal line.

9. An electronic device comprising:
the electronic-element mounting package according to claim 1; and
an electronic element that is joined to the wiring pattern.

* * * * *